(12) United States Patent
Brooks et al.

(10) Patent No.: US 7,593,483 B2
(45) Date of Patent: Sep. 22, 2009

(54) NONLINEAR MAPPING IN DIGITAL-TO-ANALOG AND ANALOG-TO-DIGITAL CONVERTERS

(75) Inventors: Todd L. Brooks, Laguna Beach, CA (US); Kevin L. Miller, Lawrenceville, GA (US); Josephus A. Van Engelen, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 659 days.

(21) Appl. No.: 11/124,394

(22) Filed: May 9, 2005

(65) Prior Publication Data

US 2005/0270203 A1    Dec. 8, 2005

Related U.S. Application Data

(60) Provisional application No. 60/568,824, filed on May 7, 2004.

(51) Int. Cl.
*H03K 9/00* (2006.01)
*H03H 7/30* (2006.01)
*H03M 1/00* (2006.01)

(52) U.S. Cl. .................. 375/316; 375/229; 375/230; 375/231; 375/232; 375/233; 375/234; 375/235; 375/236; 341/126; 341/146; 341/147; 341/148; 341/149; 341/150; 341/151; 341/152; 341/153; 341/154

(58) Field of Classification Search .............. 375/316, 375/229–236; 341/126, 146–154
See application file for complete search history.

(56) References Cited

U.S. PATENT DOCUMENTS

| | | | |
|---|---|---|---|
| 4,034,305 A | 7/1977 | Sato | |
| 4,914,439 A | 4/1990 | Nakahashi et al. | |
| 5,087,914 A * | 2/1992 | Sooch et al. | 341/120 |
| 5,144,308 A * | 9/1992 | Norsworthy | 341/131 |
| 5,309,235 A | 5/1994 | Naimpally | |
| 5,311,180 A | 5/1994 | Borgen | |
| 5,455,839 A | 10/1995 | Eyuboglu | |
| 5,625,358 A | 4/1997 | Wilson et al. | |
| 5,825,253 A | 10/1998 | Mathe et al. | |
| 5,912,745 A | 6/1999 | Ulichney | |
| 5,977,899 A * | 11/1999 | Adams | 341/145 |
| 5,999,114 A | 12/1999 | Hendricks | |
| 6,114,981 A * | 9/2000 | Nagata | 341/143 |
| 6,157,333 A | 12/2000 | Louagie et al. | |
| 6,229,466 B1 * | 5/2001 | Gattani | 341/120 |

(Continued)

*Primary Examiner*—Jason M. Perilla
(74) *Attorney, Agent, or Firm*—Sterne Kessler Goldstein & Fox, P.L.L.C.

(57) ABSTRACT

In a high-fidelity digital modulator, a mapper is provided to minimize quantization noise, jitter, and cross-talk between multiple digital-to-analog or analog-to-digital converters. The mapper receives a quantized level from a quantizer and maps the quantized level to an output sequence. The mapper includes a table defining multiple sequences corresponding to each quantized level. Each sequence includes two or more symbols, having one of multiple values. The mapper also includes a generator that selects one of the multiple sequences as the output sequence. The last symbol of a first output sequence is equal to the first symbol of the next output sequence and so on. The generator selects the output sequence by alternating between a first and a second sequence for each quantized level received. The generator selects the output sequence by alternating between sequences having a positive and a negative common mode energy for each odd valued quantized level received.

21 Claims, 13 Drawing Sheets

U.S. PATENT DOCUMENTS

| | | | |
|---|---|---|---|
| 6,278,394 B1 * | 8/2001 | May | 341/144 |
| 6,300,891 B1 | 10/2001 | Tani et al. | |
| 6,344,812 B1 * | 2/2002 | Takeda et al. | 341/143 |
| 6,404,367 B1 * | 6/2002 | Van der Zwan et al. | 341/143 |
| 6,452,521 B1 | 9/2002 | Wang et al. | |
| 6,501,405 B1 * | 12/2002 | Zhang et al. | 341/143 |
| 6,518,899 B2 * | 2/2003 | Yu | 341/118 |
| 6,587,060 B1 * | 7/2003 | Abbey | 341/143 |
| 6,614,377 B1 * | 9/2003 | Adams et al. | 341/144 |
| 6,707,855 B2 | 3/2004 | Pantana | |
| 6,735,419 B2 | 5/2004 | Mitzlaff | |
| 6,744,392 B2 * | 6/2004 | Melanson | 341/143 |
| 6,795,005 B2 * | 9/2004 | Hochschild | 341/143 |
| 6,809,672 B2 * | 10/2004 | Gupta | 341/143 |
| 6,819,725 B1 | 11/2004 | Oliver et al. | |
| 6,933,871 B2 * | 8/2005 | Melanson et al. | 341/143 |
| 7,053,808 B2 * | 5/2006 | Chen | 341/144 |
| 7,123,178 B2 * | 10/2006 | Ishizuka et al. | 341/144 |
| 7,132,968 B2 * | 11/2006 | Wang et al. | 341/143 |
| 7,205,913 B2 * | 4/2007 | Adams et al. | 341/60 |
| 7,212,874 B2 * | 5/2007 | Melanson | 700/94 |
| 7,317,410 B2 | 1/2008 | Miller | |
| 2002/0167437 A1 * | 11/2002 | Tanabe | 341/161 |
| 2003/0151528 A1 * | 8/2003 | Adams et al. | 341/50 |
| 2003/0197633 A1 * | 10/2003 | Adams et al. | 341/144 |
| 2004/0021594 A1 * | 2/2004 | Melanson | 341/143 |
| 2004/0160348 A1 * | 8/2004 | Hochschild | 341/143 |
| 2005/0040980 A1 * | 2/2005 | Miller | 341/152 |
| 2005/0040981 A1 * | 2/2005 | Miller | 341/152 |
| 2005/0110664 A1 * | 5/2005 | Chen | 341/118 |
| 2005/0116849 A1 * | 6/2005 | Melanson et al. | 341/143 |
| 2005/0116850 A1 * | 6/2005 | Hezar et al. | 341/143 |
| 2005/0141659 A1 * | 6/2005 | Capofreddi | 375/348 |
| 2005/0168365 A1 * | 8/2005 | Kaplan | 341/143 |
| 2005/0179573 A1 * | 8/2005 | Oprescu | 341/143 |
| 2005/0191980 A1 * | 9/2005 | Oliaei | 455/205 |

* cited by examiner

5-Level Odd/Even Coding

610

| Level | | | SET A | | | | | | | | | | SET B | | | | | | | | | |
|---|---|---|---|---|---|---|---|---|---|---|---|---|---|---|---|---|---|---|---|---|---|---|
| 1 | 2 | Positive | 0 | 1 | 1 | 1 | 1 | 1 | 1 | 1 | 1 | 1 | 1 | 1 | 1 | 1 | 1 | 1 | 1 | 1 | 1 | 0 |
| | | Negative | 0 | 0 | 0 | 0 | 0 | 0 | 0 | 0 | 0 | 1 | 1 | 0 | 0 | 0 | 0 | 0 | 0 | 0 | 0 | 0 |
| 2 | 1 | Positive | 0 | 0 | 0 | 1 | 1 | 1 | 1 | 1 | 1 | 1 | 1 | 1 | 1 | 1 | 1 | 1 | 1 | 0 | 0 | 0 |
| | | Negative | 0 | 0 | 0 | 0 | 0 | 0 | 0 | 1 | 1 | 1 | 1 | 1 | 1 | 0 | 0 | 0 | 0 | 0 | 0 | 0 |
| 3 | 0 | Positive | 0 | 0 | 0 | 0 | 0 | 1 | 1 | 1 | 1 | 1 | 1 | 1 | 1 | 1 | 0 | 0 | 0 | 0 | 0 | 0 |
| | | Negative | 0 | 0 | 0 | 0 | 0 | 1 | 1 | 1 | 1 | 1 | 1 | 1 | 1 | 1 | 0 | 0 | 0 | 0 | 0 | 0 |
| 4 | -1 | Positive | 0 | 0 | 0 | 0 | 0 | 0 | 0 | 1 | 1 | 1 | 1 | 1 | 0 | 0 | 0 | 0 | 0 | 0 | 0 | 0 |
| | | Negative | 0 | 0 | 0 | 1 | 1 | 1 | 1 | 1 | 1 | 1 | 1 | 1 | 1 | 1 | 1 | 1 | 0 | 0 | 0 | 0 |
| 5 | -2 | Positive | 0 | 0 | 0 | 0 | 0 | 0 | 0 | 0 | 0 | 1 | 1 | 0 | 0 | 0 | 0 | 0 | 0 | 0 | 0 | 0 |
| | | Negative | 0 | 1 | 1 | 1 | 1 | 1 | 1 | 1 | 1 | 1 | 1 | 1 | 1 | 1 | 1 | 1 | 1 | 1 | 1 | 0 |

|   |   | SET C (Early-Up) | | | | | | | | | | | SET D (Late-Up) | | | | | | | | | |
|---|---|---|---|---|---|---|---|---|---|---|---|---|---|---|---|---|---|---|---|---|---|---|
| 4 | Positive | 0 | 1 | 1 | 1 | 1 | 1 | 1 | 1 | 1 | 1 | | 0 | 1 | 1 | 1 | 1 | 1 | 1 | 1 | 1 | 1 |
|   | Negative | 0 | 0 | 0 | 0 | 0 | 0 | 0 | 0 | 0 | 1 | | 0 | 0 | 0 | 0 | 0 | 0 | 0 | 0 | 0 | 1 |
| 3 | Positive | 0 | 1 | 1 | 1 | 1 | 1 | 1 | 1 | 1 | 1 | | 0 | 0 | 0 | 1 | 1 | 1 | 1 | 1 | 1 | 1 |
|   | Negative | 0 | 0 | 0 | 0 | 0 | 0 | 0 | 1 | 1 | 1 | | 0 | 0 | 0 | 0 | 0 | 0 | 0 | 0 | 0 | 1 |
| 2 | Positive | 0 | 0 | 0 | 1 | 1 | 1 | 1 | 1 | 1 | 1 | | 0 | 0 | 0 | 1 | 1 | 1 | 1 | 1 | 1 | 1 |
|   | Negative | 0 | 0 | 0 | 0 | 0 | 0 | 0 | 1 | 1 | 1 | | 0 | 0 | 0 | 0 | 0 | 0 | 0 | 1 | 1 | 1 |
| 1 | Positive | 0 | 0 | 0 | 1 | 1 | 1 | 1 | 1 | 1 | 1 | | 0 | 0 | 0 | 0 | 0 | 1 | 1 | 1 | 1 | 1 |
|   | Negative | 0 | 0 | 0 | 0 | 0 | 1 | 1 | 1 | 1 | 1 | | 0 | 0 | 0 | 0 | 0 | 0 | 0 | 1 | 1 | 1 |
| 0 | Positive | 0 | 0 | 0 | 0 | 0 | 1 | 1 | 1 | 1 | 1 | | 0 | 0 | 0 | 0 | 0 | 1 | 1 | 1 | 1 | 1 |
|   | Negative | 0 | 0 | 0 | 0 | 0 | 1 | 1 | 1 | 1 | 1 | | 0 | 0 | 0 | 0 | 0 | 1 | 1 | 1 | 1 | 1 |
| -1 | Positive | 0 | 0 | 0 | 0 | 0 | 1 | 1 | 1 | 1 | 1 | | 0 | 0 | 0 | 0 | 0 | 0 | 0 | 1 | 1 | 1 |
|   | Negative | 0 | 0 | 0 | 1 | 1 | 1 | 1 | 1 | 1 | 1 | | 0 | 0 | 0 | 0 | 0 | 1 | 1 | 1 | 1 | 1 |
| -2 | Positive | 0 | 0 | 0 | 0 | 0 | 0 | 0 | 1 | 1 | 1 | | 0 | 0 | 0 | 0 | 0 | 0 | 0 | 1 | 1 | 1 |
|   | Negative | 0 | 0 | 0 | 1 | 1 | 1 | 1 | 1 | 1 | 1 | | 0 | 0 | 0 | 1 | 1 | 1 | 1 | 1 | 1 | 1 |
| -3 | Positive | 0 | 0 | 0 | 0 | 0 | 0 | 0 | 1 | 1 | 1 | | 0 | 0 | 0 | 0 | 0 | 0 | 0 | 0 | 0 | 1 |
|   | Negative | 0 | 1 | 1 | 1 | 1 | 1 | 1 | 1 | 1 | 1 | | 0 | 0 | 0 | 1 | 1 | 1 | 1 | 1 | 1 | 1 |
| -4 | Positive | 0 | 0 | 0 | 0 | 0 | 0 | 0 | 0 | 0 | 1 | | 0 | 0 | 0 | 0 | 0 | 0 | 0 | 0 | 0 | 1 |
|   | Negative | 0 | 1 | 1 | 1 | 1 | 1 | 1 | 1 | 1 | 1 | | 0 | 1 | 1 | 1 | 1 | 1 | 1 | 1 | 1 | 1 |

FIG. 8A

|  |  | SET E (Early-Down) | | | | | | | | | | | SET F (Late-Down) | | | | | | | | | |
| --- | --- | --- | --- | --- | --- | --- | --- | --- | --- | --- | --- | --- | --- | --- | --- | --- | --- | --- | --- | --- | --- | --- |
| 4 | Positive | 1 | 1 | 1 | 1 | 1 | 1 | 1 | 1 | 1 | 0 | | 1 | 1 | 1 | 1 | 1 | 1 | 1 | 1 | 1 | 0 |
|  | Negative | 1 | 0 | 0 | 0 | 0 | 0 | 0 | 0 | 0 | 0 | | 1 | 0 | 0 | 0 | 0 | 0 | 0 | 0 | 0 | 0 |
| 3 | Positive | 1 | 1 | 1 | 1 | 1 | 1 | 1 | 0 | 0 | 0 | | 1 | 1 | 1 | 1 | 1 | 1 | 1 | 1 | 1 | 0 |
|  | Negative | 1 | 0 | 0 | 0 | 0 | 0 | 0 | 0 | 0 | 0 | | 1 | 1 | 1 | 0 | 0 | 0 | 0 | 0 | 0 | 0 |
| 2 | Positive | 1 | 1 | 1 | 1 | 1 | 1 | 1 | 0 | 0 | 0 | | 1 | 1 | 1 | 1 | 1 | 1 | 1 | 0 | 0 | 0 |
|  | Negative | 1 | 1 | 1 | 0 | 0 | 0 | 0 | 0 | 0 | 0 | | 1 | 1 | 1 | 0 | 0 | 0 | 0 | 0 | 0 | 0 |
| 1 | Positive | 1 | 1 | 1 | 1 | 1 | 0 | 0 | 0 | 0 | 0 | | 1 | 1 | 1 | 1 | 1 | 1 | 1 | 0 | 0 | 0 |
|  | Negative | 1 | 1 | 1 | 0 | 0 | 0 | 0 | 0 | 0 | 0 | | 1 | 1 | 1 | 1 | 1 | 0 | 0 | 0 | 0 | 0 |
| 0 | Positive | 1 | 1 | 1 | 1 | 1 | 0 | 0 | 0 | 0 | 0 | | 1 | 1 | 1 | 1 | 1 | 0 | 0 | 0 | 0 | 0 |
|  | Negative | 1 | 1 | 1 | 1 | 1 | 0 | 0 | 0 | 0 | 0 | | 1 | 1 | 1 | 1 | 1 | 0 | 0 | 0 | 0 | 0 |
| -1 | Positive | 1 | 1 | 1 | 0 | 0 | 0 | 0 | 0 | 0 | 0 | | 1 | 1 | 1 | 1 | 1 | 0 | 0 | 0 | 0 | 0 |
|  | Negative | 1 | 1 | 1 | 1 | 1 | 0 | 0 | 0 | 0 | 0 | | 1 | 1 | 1 | 1 | 1 | 1 | 1 | 0 | 0 | 0 |
| -2 | Positive | 1 | 1 | 1 | 0 | 0 | 0 | 0 | 0 | 0 | 0 | | 1 | 1 | 1 | 0 | 0 | 0 | 0 | 0 | 0 | 0 |
|  | Negative | 1 | 1 | 1 | 1 | 1 | 1 | 1 | 0 | 0 | 0 | | 1 | 1 | 1 | 1 | 1 | 1 | 1 | 0 | 0 | 0 |
| -3 | Positive | 1 | 0 | 0 | 0 | 0 | 0 | 0 | 0 | 0 | 0 | | 1 | 1 | 1 | 0 | 0 | 0 | 0 | 0 | 0 | 0 |
|  | Negative | 1 | 1 | 1 | 1 | 1 | 1 | 1 | 0 | 0 | 0 | | 1 | 1 | 1 | 1 | 1 | 1 | 1 | 1 | 1 | 0 |
| -4 | Positive | 1 | 0 | 0 | 0 | 0 | 0 | 0 | 0 | 0 | 0 | | 1 | 0 | 0 | 0 | 0 | 0 | 0 | 0 | 0 | 0 |
|  | Negative | 1 | 1 | 1 | 1 | 1 | 1 | 1 | 1 | 1 | 0 | | 1 | 1 | 1 | 1 | 1 | 1 | 1 | 1 | 1 | 0 |

FIG. 8B

NONLINEAR MAPPING IN DIGITAL-TO-ANALOG AND ANALOG-TO-DIGITAL CONVERTERS

CROSS REFERENCE TO RELATED APPLICATIONS

This application claims priority to U.S. Provisional Application No. 60/568,824, entitled "Nonlinear Mapping in Digital-to-Analog and Analog-to-Digital Converters," filed May 7, 2004, which is incorporated herein by reference in its entirety.

FIELD OF THE INVENTION

The present invention is generally related to systems and methods for non-linear mapping of output signals in digital-to-analog (D/A) and analog-to-digital (A/D) converters.

BACKGROUND

Digital-to-analog (D/A) converters are used to process digital audio signals. Typically, digital data signals are received from a digital replay device or over a network, such as a cable television network. The signals are then processed by a D/A converter in an audio amplifier, cable receiver, or other audio device to produce an analog output within a frequency range that, when connected to a transducer such as a speaker, generates human audible sounds.

D/A converters used in high-fidelity audio processing typically include digital modulators that convert highly oversampled digital values from high precision (e.g., 16-20 bits) to low precision (e.g., 1-3 bits), with the objective of substantially eliminating noise from the human audible band. However, quantization noise inherently increases with this reduction of precision.

To prepare these low precision signals for conversion to analog form, the signals are mapped into digital sequences. This process is known as sequence mapping. An analog signal is typically generated from the mapped digital signal. A sequence mapper can help to reduce additional noise which is caused by transition errors in the analog circuitry. The performance impact caused by these transition errors can be decreased by reducing the frequency of the modulator code transitions.

What is needed therefore is a sequence mapper that can be used in a D/A converter or A/D converter to improve performance by enabling a reduction of the frequency of modulator code transitions.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 6A illustrates exemplary serial output level sequences of the output sets for a 5-level coding scheme.

FIG. 6B illustrates exemplary serial output level sequences of the output sets for a 27-level coding scheme.

FIG. 6C illustrates exemplary serial output level sequences of the output sets for a 25-level coding scheme.

FIGS. 8A and 8B illustrate exemplary serial output level sequences of the output sets for a 9-level coding scheme.

Figure 1:
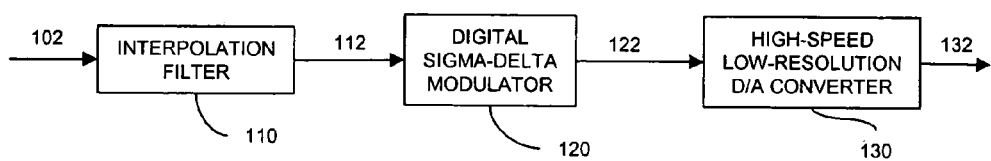
FIG. 1 depicts a conventional oversampled D/A converter.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

Modern fine geometry CMOS devices are capable of processing signals at rates many times higher than audio frequencies. Oversampling techniques are used to maintain high signal fidelity by processing signals at high rates. For this reason, oversampling techniques are commonly used to process audio signals.

An audio digital-to-analog (D/A) converter converts digital audio signals into analog audio signals. Oversampling techniques are typically used in audio D/A converters to improve the fidelity of the analog output signal so that it accurately represents the digital signal at the input of the D/A converter.

1. Overview

FIG. 1 depicts a conventional oversampled D/A converter 100. D/A converter 100 includes an interpolation filter 110, a digital sigma-delta modulator 120, and a high-speed, low resolution D/A converter 130. Interpolation filter 110 receives an input digital signal 102 and increases the sample rate of the input digital signal 102 from a low sample rate to a high sample rate. The digital sigma-delta modulator 120 receives the interpolated digital signal 112 from the interpolation filter 110 and reduces the resolution of the signal by reducing the number of bits required to represent the signal. The digital output signal 122 of the digital sigma-delta modulator 130 is then converted to an analog output signal 132 using the high-speed, low-resolution D/A converter 130.

Many D/A converters have single-bit output implementations. A single-bit D/A converter provides two output analog levels. A single-bit implementation is the lowest resolution possible, and can therefore be implemented with low cost. Furthermore, a single-bit D/A converter is inherently linear. The linearity of this circuit does not depend upon the manufacturing process.

The advantage of an oversampled implementation of a D/A converter, as shown in FIG. 1, is that high-fidelity can be maintained without requiring expensive high-resolution D/A converter circuitry. The power and area (i.e., cost) of high-resolution D/A circuitry is greater and as a result, the performance of this circuitry may be limited by manufacture process tolerances. In contrast, low-resolution D/A converter circuitry is less expensive and avoids significant performance limitations due to the manufacturing process.

Figure 2A:
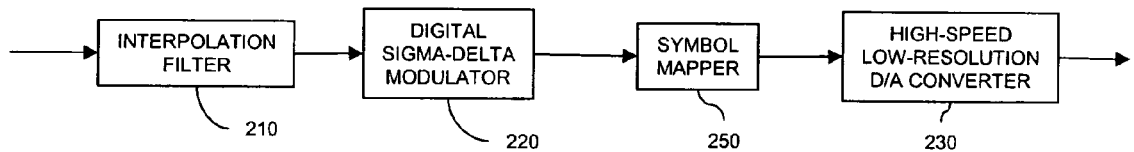
FIG. 2A depicts an oversampled D/A converter including a non-linear symbol mapper external to the modulator loop, according to an embodiment of the invention.

FIG. 2A shows an oversampled D/A converter 200A including a non-linear symbol mapper external to the modulator loop, according to an embodiment of the invention. In this embodiment, interpolation filter 210 is coupled to sigma-delta modulator 220. A non-linear symbol mapper 250 is coupled between the digital sigma-delta modulator 220 and a high-speed, low-resolution D/A Converter 230. Non-linear mapper 250 is described in more detail below in Section 2.

Figure 2B:
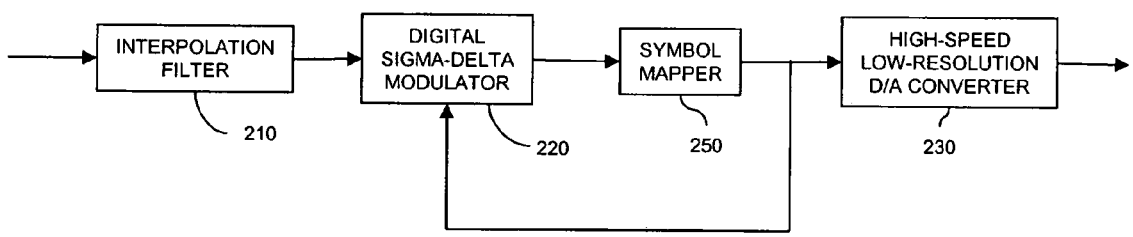
FIG. 2B depicts an oversampled D/A converter including a non-linear symbol mapper inside the modulator loop, according to an embodiment of the invention.

FIG. 2B shows an oversampled D/A converter 200B including a non-linear symbol mapper inside the modulator loop, according to an embodiment of the invention. In this embodiment, the output from non-linear symbol mapper 250 is fed back as an input to sigma-delta modulator 220. Non-linear mapper 250 is described in more detail below in Section 2.

Figure 3:
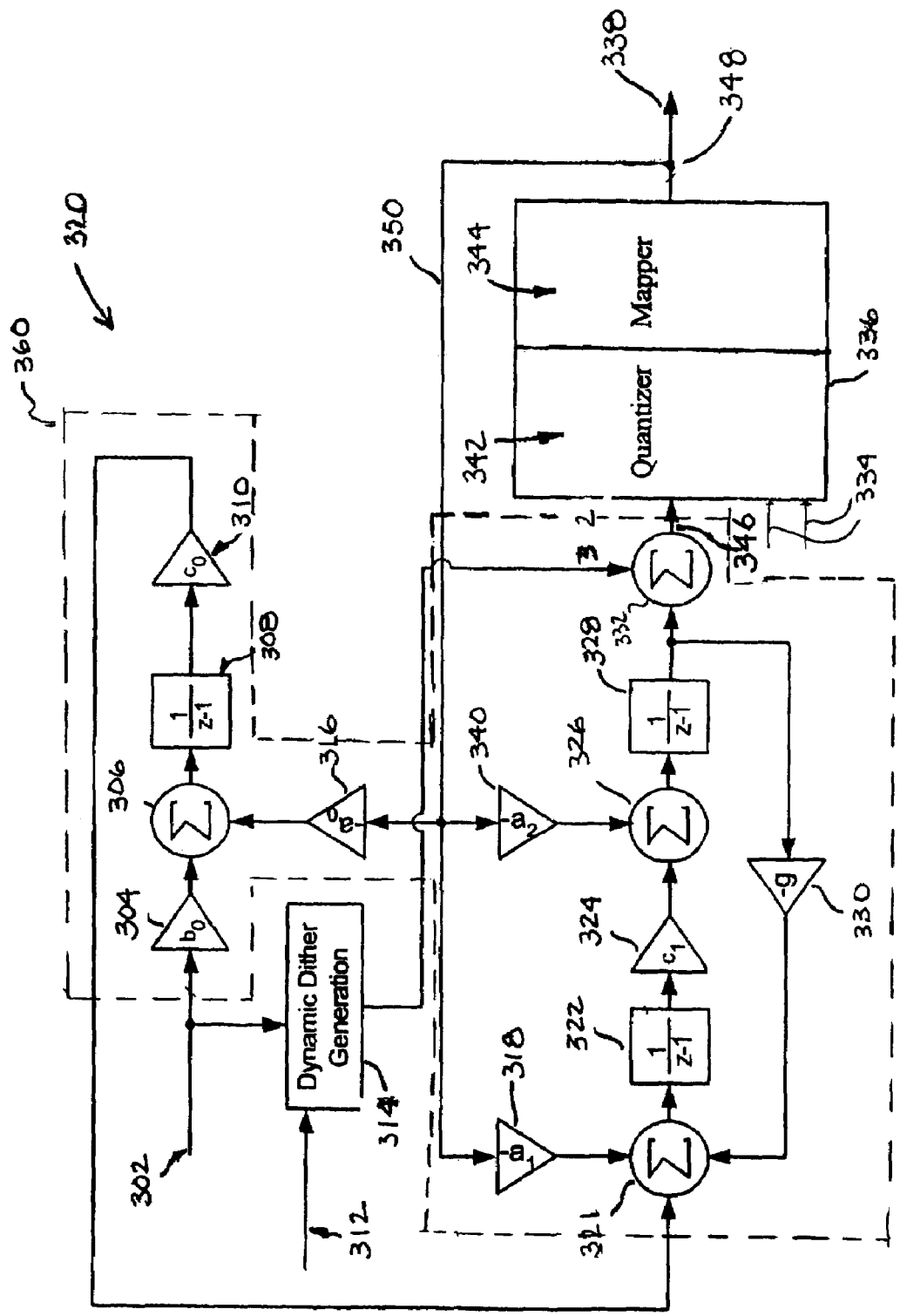
FIG. 3 is a block diagram of a digital modulator including a non-linear symbol mapper, according to an embodiment of the invention.

FIG. 3 shows an exemplary digital modulator 320, according to an embodiment of the invention. In this embodiment, the non-linear symbol mapper 344 is included within the feedback loop 350 of digital modulator 320. Non-linear mapper 344 is described in detail below in Section 2.

In FIG. 3, the digital modulator is shown generally at 320. Digital modulator 320 has an input 302 and an output 338. Digital modulator 320 comprises a loop filter 360, an optional dither generation circuit 314, and a mapping circuit 336 incorporating a quantizer 342 and a mapper 344. Loop filter 360 includes gain stages 304, 310, 316, 318, 324, 330, and 340, summing points 306, 321, 326, and 332, and integrators 308, 322, and 328. Loop filter 360 is one embodiment of a loop-filter within the modulator 320. As would be appreciated by a person of skill in the art, other embodiments of loop filter 360 are possible. Mapping circuit 336 has an input 346 and a feedback point 348 at its output 338 from which a feedback loop 350 extends to an input of each of gain stages 316, 318 and 340, respectively.

Digital modulator 320 is shown in block schematic form. The circuit represented by this diagram may be implemented in software operating on a general purpose processor, in hardware such as a custom integrated circuit, or in combinations thereof. Both hardware and software implementations are workable. Hardware implementations currently have a lower cost and may be faster, and are generally preferred for these reasons.

Input 302 receives a high-precision digital signal (typically 18-20 bits) such as, for example, a digital cable TV audio signal or other high-precision information signal. Input 302 is coupled to the input of gain stage 304 of loop filter 360 and is also coupled as a control input to optional dynamic dither generation circuit 314. When the received input signal at input 302 has a low amplitude (below a predetermined threshold), dither generation circuit 314 is activated to introduce a dither signal to prevent the circuit from generating audible idle tone at output 338. The dither signal output of dither generation circuit 314 is connected to summing point 332 of loop filter 360. The dither signal output may be generated conventionally, such as by operating a guassian random sample generator.

Although FIG. 3 depicts mapper 344 as being included within feedback loop 350 of digital modulator 320, mapper 344 may also be included external to feedback loop 350.

In loop filter 360, the outputs of gain stage 304 and gain stage 316 are coupled to summing point 306. The output of summing point 306 is coupled as an input to integrator 308. The output of integrator 308 is coupled as an input to gain stage 310. The output of gain stage 310 is coupled to summing point 321.

Feedback loop 350 extends from feedback point 348 at the output of mapper 344 and is coupled to the inputs of gain stage 340, gain stage 318, and gain stage 316. Gain stage 318 is coupled to summing point 321. The output of summing point 321 is fed as input to integrator 322. The output of integrator 322 is provided as input to gain stage 324. The output of gain stage 324 is provided as input to summing point 326. The output of gain stage 340 is also provided as input to summing point 326. The output of summing point 326 is provided as input to integrator 328. The output of integrator 328 and the output of optional dynamic dither generation circuit 314 are provided to summing point 332. The output of summing point 332 is provided as input to quantizer 342. Another feedback loop is connected from the output of integrator 328 to the input of gain stage 330. The output of gain stage 330 is coupled to summing point 321.

The gain values of the gain stages in loop filter 360 are determined based on the application and/or the bandwidth of the input and desired output.

Quantizer 342 converts data received to one of a plurality of levels at one or more defined sampling rates. Quantizer specifications may be determined according to requirements of the individual application. Quantizer 342 has one or more clock inputs 334 such that quantizer 342 is provide with or can derive a clock signal for each sampling rate desired during operation.

Figure 10:
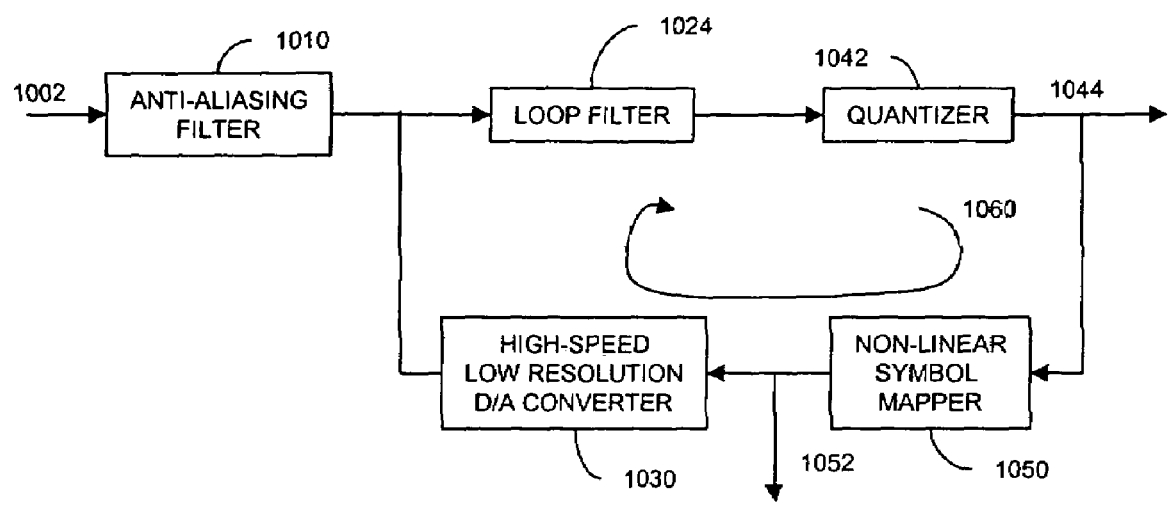
FIG. 10 is a block diagram of a A/D converter including a non-linear symbol mapper, according to an embodiment of the invention.

Although the invention is described above in the context of a D/A converter, the invention is also applicable to A/D converters. FIG. 10 shows an A/D converter 100 including a non-linear symbol mapper inside the modulator loop, according to an embodiment of the invention. In this embodiment, anti-aliasing filter 1010 is coupled to loop filter 1024. Loop filter 1024 is coupled to quantizer 1042. A non-linear symbol mapper 1050 is coupled between quantizer 1042 and a high-speed, low-resolution D/A Converter 1030. The non-linear symbol mapper 1050 is in the feedback loop 1060 of the modulator. Non-linear mapper 1050 is described in more detail below in Section 2.

In one embodiment, the quantizer digital output signal 1044 and the mapper digital output signal 1052 are connected to a decimation filter (not shown) that reduces the sample rate from the high quantizer sample rate (or even higher mapper sample rate) to a lower sample rate while maintaining fidelity by increasing the signal resolution (i.e., number of bits used to represent the signal).

Figure 4:
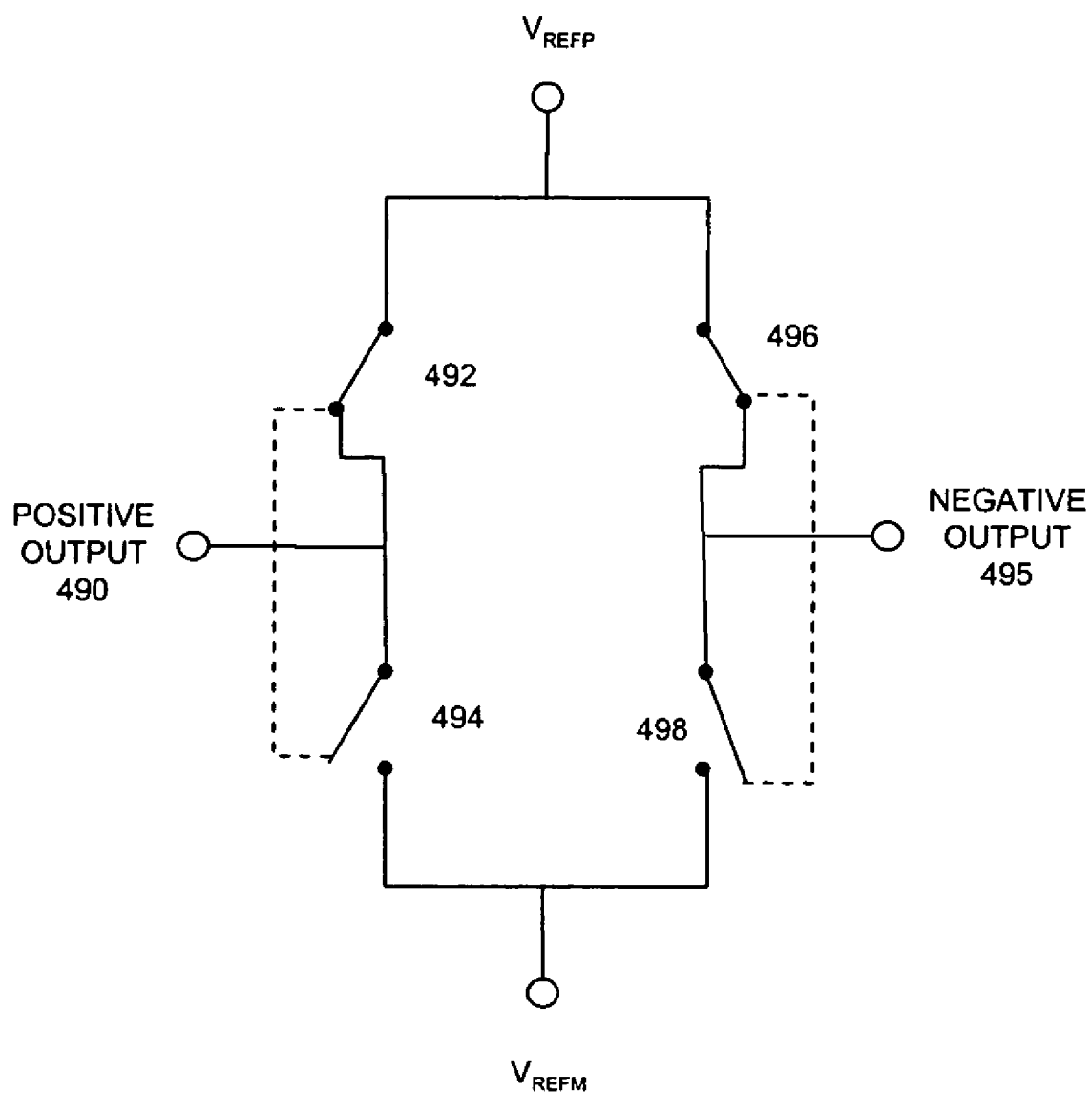
FIG. 4 is a block diagram of a differential D/A converter, according to an embodiment of the invention.

In one embodiment of the invention, D/A converters and A/D converters including non-linear mapping, such as shown in FIGS. 2 and 10 include differential converters to implement high-speed low-resolution D/A converters 230 and 1030. FIG. 4 depicts a block diagram of a differential converter 400. Differential converter 400 has two outputs, a positive output 490 and a negative output 495. Each output can generate either a high level (e.g., 1) or low level signal (e.g., 0). Switch 492 and switch 494 are turned on and off in a complementary fashion. If switch 492 is on, then switch 494 is off and if switch 494 is on then switch 492 is turned off. Switch 496 and 498 are also turned on and off in a complementary fashion. Depending on the states of the four switches, the voltages at the two outputs 490 and 495 are driven by the switches to either a high voltage, $V_{REFP}$, or to a low voltage, $V_{REFM}$. An equivalent circuit may be implemented using two digital driver circuits, with switches 492 and 494 replaced with one digital driver and switches 496 and 498 replaced with a second digital driver. In this equivalent implementation, the voltages at the two outputs 490 and 495 are driven either to high voltage which corresponds to the high output level of the digital drivers or to a low voltage which corresponds to the low output level of the digital drivers.

In the differential converter of FIG. 4, three output levels are available (−1, 0, and +1). The three available output levels are driven differentially to generate the desired output sequence. For example, a 0 output level may be generated by setting the voltages at both positive output 490 and negative output 495 to HIGH or by setting the voltages at both positive output 490 and negative output 495 to LOW. A −1 level is generated by setting the positive output 490 to LOW and setting the negative output 495 to HIGH. A +1 level is generated by setting the positive output 490 to HIGH and setting the negative output 495 to LOW.

2. Non-Linear Mapper

2.1 General

Figure 5A:
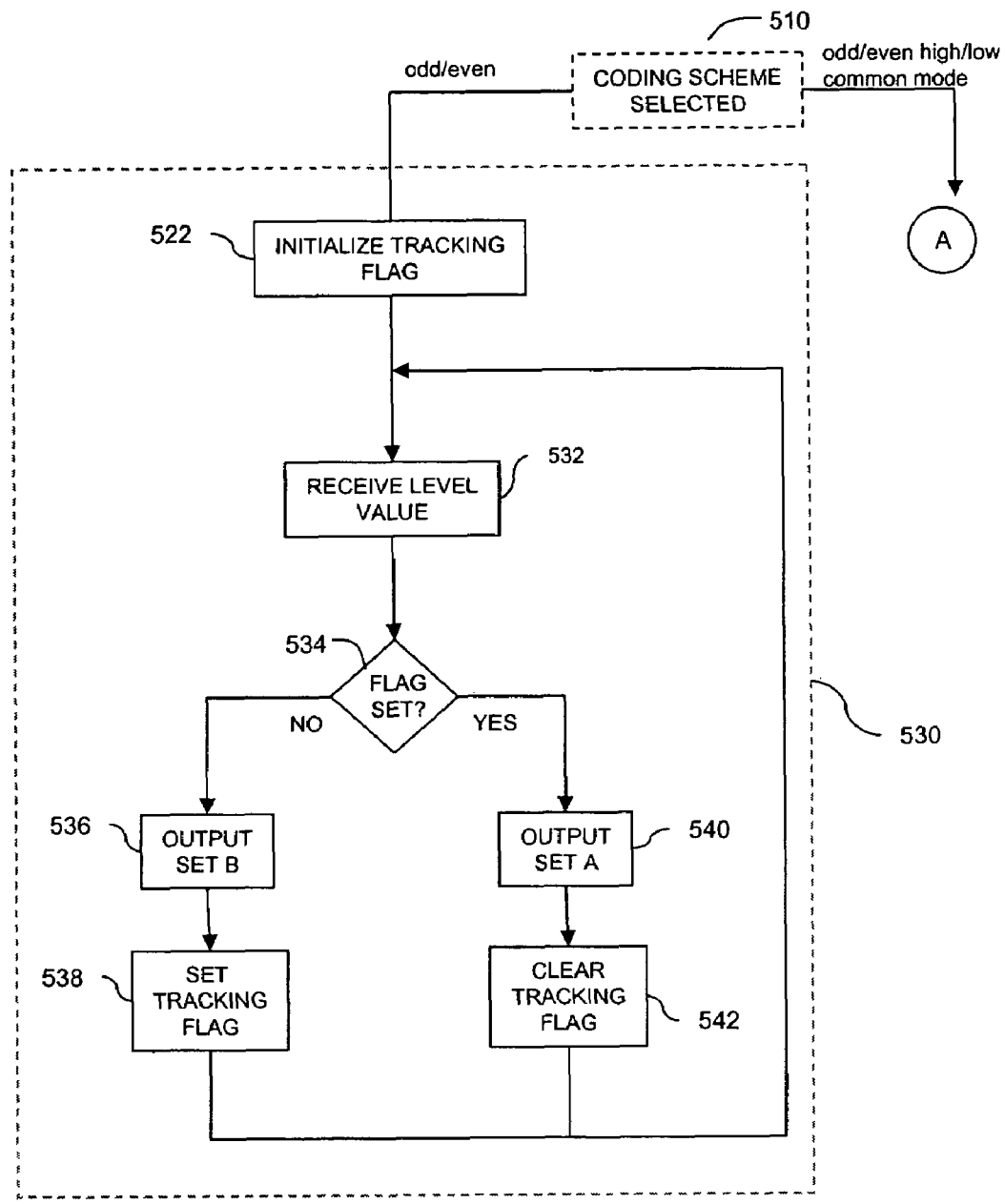
FIGS. 5A and 5B are flow charts of a method for mapping input signals to output signals, according to an embodiment of the invention.
Figure 5B:
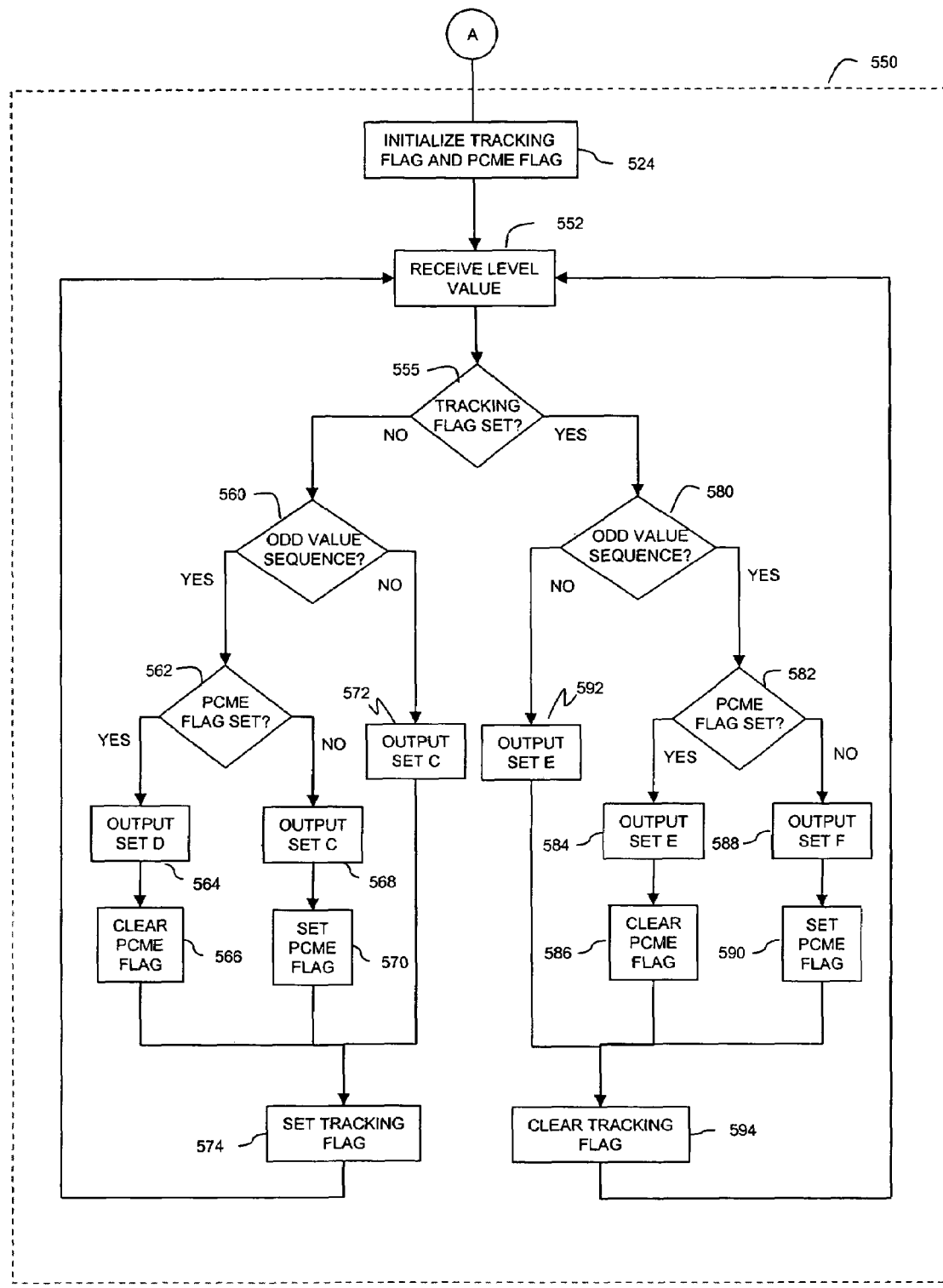

Each non-linear mapper 250, 344, and 1050 operates according to the method 500 depicted in flow chart of FIGS. 5A and 5B. In one embodiment, a non-linear mapper is configured to support a plurality of coding level schemes (e.g., 5-level, 9-level, 25-level, etc.). Alternatively, a non-linear mapper supports a single coding level scheme.

In an exemplary coding level sequence, non-linear mapper has one or more of the following properties. First, both the positive output 490 and negative output 495 (shown in FIG. 4) are at the same level at the beginning of a sequence (e.g., both are LOW) and both the positive output 490 and negative output 495 are at the opposite level at the end of a sequence (e.g., both are HIGH). In addition, both the positive output 490 and the negative output 495 retain the level of the prior sequence at the beginning of the next sequence. Therefore, no transitions occur on either output between sequences. This reduces the amount of transitions in the output of the converter, and therefore, reduces cross-talk and the sensitivity of the circuit to clock jitter. These characteristics are illustrated in the exemplary output signal of FIG. 7 and in the exemplary coding sequences of FIGS. 6A, 8A, and 8B.

In addition, an exemplary supported coding scheme has a minimum spacing of two sequence symbols (or mapper output clock periods) between transitions in adjacent sequences and possibly between all transitions in the set of output sequences of the mapper. This increased transition spacing helps to reduce crosstalk and self-induced switching noise on the output waveforms. This further maximizes the time between transitions, not only between code sequences of a single mapper but also between simultaneously occurring code sequences of multiple mappers. For example, a code sequence of a mapper consists of N symbols (e.g., differential −1,0,+1). If a code sequence is started with the same symbol (e.g., 0) as the previous sequence ended, the minimum spacing between the last transition of one sequence to the first transition of the following sequence is already two symbols or clock periods of the mapper.

For an exemplary supported coding scheme, the code sequences used for the zero level output of the quantizer preferably have no differential transitions. In addition, the number of differential transitions in all code sequences supported is preferably minimized. This further reduces the sensitivity of the circuit to clock jitter.

The time (or number of sequence symbols) between differential and/or single-ended transitions, both within a single code sequence and between all code sequences of a single mapper, is maximized to reduce the effect of crosstalk and Inter-Symbol Interference (ISI) due to power supply glitches at each transition.

In an exemplary supported coding scheme, the mapping provides a linear mapping for its low (or in-band) frequency signal energy content. That is, the set of integrated values of the code sequences (and D/A signal waveforms) is preferably linear.

In an exemplary supported coding scheme, the in-band common mode energy is minimized. The minimization is accomplished by making the common mode of the positive and negative output sequences the same for every code level. In addition or alternatively, if the common mode of the positive and negative sequences is code level dependent, the minimization is accomplished by using several mappings for every code level (e.g., one sequence with a high common mode and one with a low common mode) and for every output sample of the quantizer, selecting the mapping that will minimize the total integrated in-band common mode energy.

In addition, the pulse density or low frequency signal energy of the output sequence of the highest code level is maximized and the maximum stable input range of the modulator is also maximized.

Figure 6B:
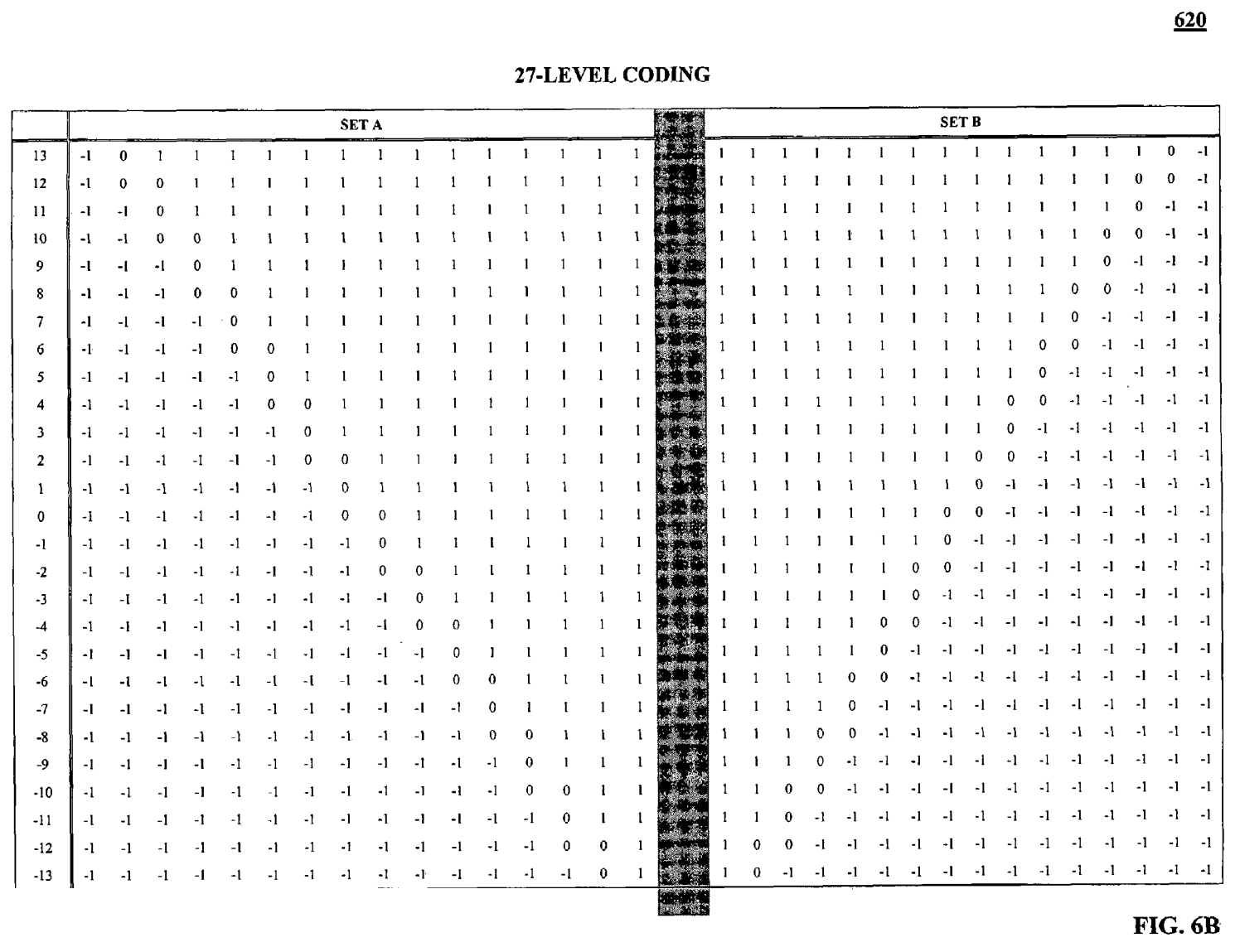
Figure 6C:
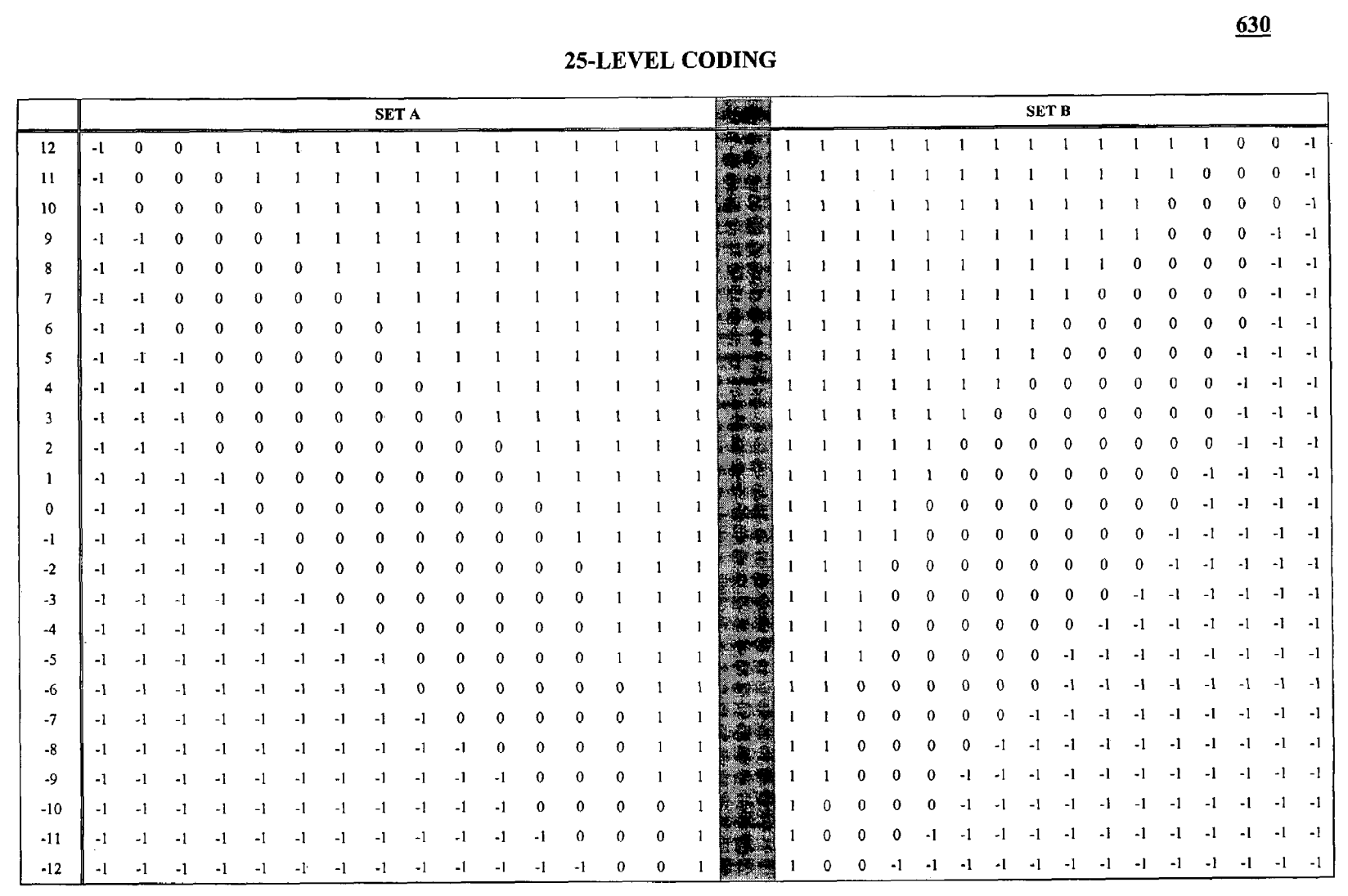

Additional exemplary coding sequences having one or more of the above properties are illustrated in FIGS. 6B and 6C.

2.1 Method for Non-Linear Mapping

FIG. 5A is a flowchart of a method 500 for non-linear mapping in a D/A or A/D converter. Note that some steps shown in the flowchart do not necessarily have to occur in the order shown. Other orders are possible. Method 500 begins with optional block 510 when the process determines what coding level scheme to apply to a received signal. The coding scheme used determines the number of output sequences that drive outputs 490 and 495 (shown in FIG. 4). FIG. 5A depicts two coding schemes, odd/even scheme and odd/even high/low common mode scheme. In addition or alternatively, different output coding schemes can be used with the present invention. The output scheme is selectable by programming the configuration of the converter.

If odd/even scheme coding is set, operation proceeds to block 530. If odd/even high/low common mode scheme coding is set, operation proceeds to block 550, depicted in FIG. 5B.

In the exemplary embodiment of FIG. 5A, in block 530, process 500 performs odd/even scheme coding with pulse sequences. In odd/even scheme coding, the available output sequences are divided into two groups, Set A and Set B. Each time a code level is received by the mapper, the mapper chooses a corresponding sequence from either Set A or Set B. The selected corresponding sequence includes a coding sequence for the positive output 490 and a coding sequence for the negative output 495. In a preferred embodiment, Set A sequences and Set B sequences are alternated. That is, Set A sequence is followed by a Set B sequence and a Set B sequence is always followed by a Set A sequence.

The odd/even scheme coding process begins at step 522 when a tracking flag is initialized. The initialization is optional and the initial setting of the flag may be selected arbitrarily, since the output will be alternated between settings corresponding to two possible tracking flag values.

In step 532, non-linear mapper 344 receives a code level from a quantizer, such as the quantizer depicted in FIGS. 3 and 10, or from a sigma-delta modulator, such as depicted in FIGS. 2A and 2B.

A quantizer converts input data to one of a plurality of code levels at one or more defined sampling rates. Quantizer specifications may be determined according to the requirements of an individual application. For example, the quantizer may be a five-level quantizer that generates an output that is one of five levels from the set consisting of {2, 1, 0, −1, −2}. In another example, the quantizer may be a nine-level quantizer that generates an output that is one of nine levels from the set consisting of {4, 3, 2, 1, 0, −1, −2, −3, −4}. As would be appreciated by persons of ordinary skill in the art, other types of quantizers may be used with the present invention.

In step 534, the process determines whether the tracking flag is set. If the tracking flag is set, control proceeds to step 540. If the tracking flag is not set, control proceeds to step 536.

In step 540, a Set A serial output level sequence corresponding to the received input value is generated. Operation then proceeds to step 542. FIGS. 6A-6C depict exemplary Set A sequences for 5-Level, 27-Level, and 25-Level coding. For example, if a received input level is 7 for a 25-level coding, the Set A serial output level sequence is −1 −1 0 0 0 0 1 1 1 1 1 1 1 1.

In step 542, the tracking flag is cleared.

In step 536, a Set B serial output level sequence corresponding to the input value is generated. Operation then proceeds to step 538. For example, if a received input level is 7 for a 25-level coding, the Set B serial output level sequence is 1 1 1 1 1 1 1 1 0 0 0 0 0 −1 −1.

In step 538, the tracking flag is set.

Control then returns to step 532 where the next input value is received. When a 5-level odd/even coding scheme is used, 10 clock periods of the clock (e.g., 27 MHz clock) are required to generate each output sequence. In this example, the sigma delta modulator of the converter is designed to produce output values at a 27/10=2.7 MHz rate.

Exemplary serial output level sequences 610 for Set A and Set B outputs for a 5-level odd/even coding are shown in FIG. 6A. As can be seen in FIG. 6A, the 5-level coding includes a minimum spacing of two clock periods between transitions in the adjacent codes. This helps to reduce crosstalk and self-induced switching noise on the output waveforms.

Exemplary serial output level sequences 620 for Set A and Set B outputs for a 27-level odd/even coding are shown in FIG. 6B. The exemplary bit sequences 620 use a "constant-zero" coding sequence. In this coding, the number of 0 levels in the Set A sequences is equal to the number of 0 levels for the corresponding Set B sequences. This dramatically reduces the common-mode component of the signal energy. By forcing identical numbers of 0 levels in Set A and Set B, the average common mode signal energy has a zero value at DC. The result of this common mode zero is that the common mode energy level in band with this coding scheme is suppressed 69 dB below the full scale differential signal energy level. However, 27-level coding is less preferred due to crosstalk and self-induced switching noise performance limitations.

Exemplary serial bit sequences 630 for Set A and Set B outputs for a 25-level odd/even coding are shown in FIG. 6C. Unlike the 27-bit odd/even coding, the 25-level coding does not use a "constant-zero" coding sequence. The 25-level coding instead produces an output signal which has a large common-mode signal component. The common-mode component could degrade signal-to-noise and distortion ratio (SNDR) performance when the common-mode output signal is partially converted into a differential output signal due to component mismatches in circuitry connected to the differential converter outputs. For example, resistors could be used to connect the differential converter outputs to an amplifier. SNDR degradation can occur when the resistors are not perfectly matched. If the resistors are perfectly matched, then the amplifier has very good common-mode rejection. Then, any common-mode noise or common-mode harmonic components in the converter output waveform are attenuated sufficiently such that these do not degrade the signal at the output of the amplifier. However, 25-level coding is less preferred because small mismatches in resistors reduce the common-mode rejection capability of an amplifier circuitry. This can seriously degrade the performance of a converter using 25-level coding.

FIG. 5B depicts the odd/even high/low common mode coding process 550. In block 550, an odd/even high/low common mode output coding with pulse sequences is performed. In an oversampled D/A converter, such as depicted in FIG. 2, the digital modulator converts highly over-sampled digital values from high precision (typically 16-20 bits) to low precision (typically 1-3 bits). Quantization noise inherently increases with the reduction in precision. By using an odd/even high/low common mode coding scheme with several bits of precision, process 550 has the advantage of reducing quantization noise such that a less aggressive noise transfer function can be used to reduce the frequency of code transitions while still needing only a 1-bit (2-level) or 1.5 bit (3-level) differential output stage, as shown in FIG. 4. However, a disadvantage of the odd/even high/low common mode coding is that it generates common-mode signal energy. The odd/even high/low common mode coding process depicted in FIG. 5B is designed to minimize the common-mode signal energy.

In odd/even high/low common mode output coding, the available output sequences are divided into four groups, Set C, Set D, Set E, and Set F. Exemplary coding for these sets is shown in FIGS. 8A and 8B. Each sequence in the four sets includes a coding sequence for the positive output 490 and a coding sequence for the negative output 495. Sets C and D are odd sequences and Sets E and F are even sequences. The choice of using an odd sequence or an even sequence may be alternated. That is, an odd sequence is preferably followed by an even sequence and an even sequence is preferably followed by an odd sequence. Set C is an early-up sequence, set D is a late-up sequence, set E is an early-down sequence, and set F is a late-down sequence. The odd-valued (i.e., 3, 1, −1, 3) early-up sequences produce positive common-mode energy and the odd-valued late-up sequences produce negative common-mode energy. The odd-valued early-down sequences produce negative common-mode energy and the odd-valued late-down sequences produce positive common-mode energy. During process 550, the choice of early-up, late-up, early-down, or late-down sequence is preferably made such that a sequence having a positive common mode energy is always followed as quickly as possible by a sequence having a negative common-mode energy as the next available odd-valued sequence. The even codes (i.e., 4, 2, 0, −2, −4) do not produce common-mode energy. Exemplary serial bit sequences for Sets C, D, E, and F outputs are shown in FIGS. 8A and 8B.

The odd/even high/low common mode output coding process begins at block 524 when a tracking flag and a positive common-mode energy (PCME) flag are initialized. In the preferred embodiment, the initialization is optional and the initial setting of the flags may be selected arbitrarily, since in this embodiment the output will be alternated between settings corresponding to two possible tracking flag values and two possible PCME flag values.

In step 552, non-linear mapper 344 receives a code level from a quantizer, such as quantizer 342 depicted in FIG. 3 or from a sigma-delta modulator, such as depicted in FIG. 2.

In step 554, the process determines whether the tracking flag is set. If the tracking flag is set, operation proceeds to step 580. If the tracking flag is not set operation proceeds to step 560.

In step 560, the process determines whether the received value is represented by an odd-valued sequence. If an odd-valued sequence is required, operation proceeds to step 562. If an odd-valued sequence is not required, operation proceeds to step 572.

In step 572, a Set C serial output level sequence corresponding to the input value is generated and operation proceeds to step 574.

In step 562, the process determines whether the PCME flag is set. If the PCME flag is set, operation proceeds to step 564. If the PCME flag is not set, operation proceeds to step 568.

In step 564, a Set D serial output level sequence corresponding to the input value is generated. This sequence is a late-up sequence having a negative common-mode energy. In step 566, the PCME flag is cleared and operation proceeds to step 574.

In step 568, a Set C serial output level sequence corresponding to the input value is generated. This sequence is an early-up sequence having a positive common-mode energy. In step 570, the PCME flag is set and operation proceeds to step 574.

In step 574, the tracking flag is set.

In step 580, the process determines whether the received value is represented by an odd-valued sequence. If an odd-valued sequence is required, operation proceeds to step 582. If an odd-valued sequence is not required, operation proceeds to step 592.

In step 592, a Set E serial output level sequence corresponding to the input value is generated and operation proceeds to step 594.

In step 582, the process determines whether the PCME flag is set. If the PCME flag is set, operation proceeds to step 584. If the PCME flag is not set, operation proceeds to step 588.

In step 584, a Set E serial output level sequence corresponding to the input value is generated. This sequence is an early-down sequence having a negative common-mode energy. In step 586, the PCME flag is cleared and operation proceeds to step 594.

In step 588, a Set F serial bit sequence corresponding to the input value is generated. This sequence is a late-down sequence having a positive common-mode energy. In step 590, the PCME flag is set and operation proceeds to step 594.

In step 594, the tracking flag is cleared.

Control then returns to step 552 where the next input value is received. The odd/even high/low common mode coding process may also require 10 clock periods of the clock (e.g., 27 MHz clock) to generate each output sequence. The sigma delta modulator of the D/A converter is designed to produce output values at a 27/10=2.7 MHz rate.

Figure 7:
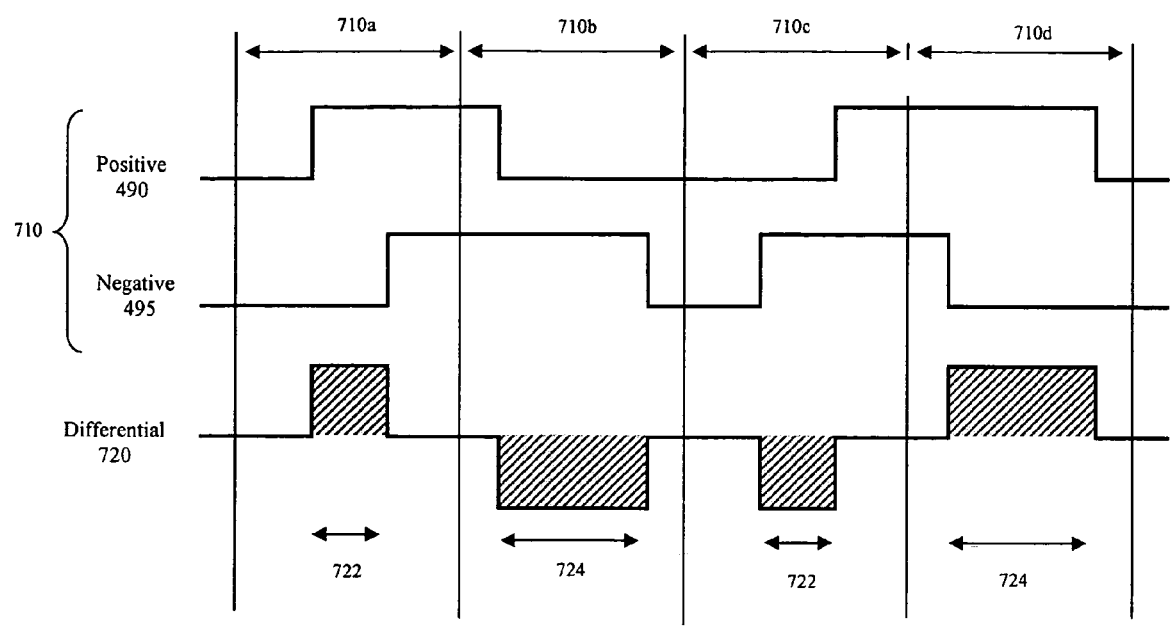
FIG. 7 illustrates an exemplary output signal for a D/A converter including a non-linear mapper.

FIG. 7 depicts an exemplary D/A converter output signal 710 having 4 pulses, 710a, 710b, 710c, and 710d and a differential signal 720. FIG. 7 is representative of a mapper 250/344 using a 5-level coding scheme (as shown in FIG. 6A). The differential signal has 2 unique pulse widths 722, 724 and 3 voltage levels which are used to represent the 5 unique levels. Pulse 710a represents the sequence equivalent to level 2 (value=+1) of Set A. In pulse 710a, the voltage at both the positive output 490 and the negative output 495 start at LOW and transition at different times to HIGH causing differential signal 720 to start and end at zero value. Both the positive output 490 and the negative output 495 are at HIGH at the end of the pulse and the beginning of the next pulse. The differential signal 720 during pulse 710a has a first pulse width 722 at a positive value.

Pulse 710b represents the sequence equivalent to level 5 (value=−2) of Set B. In pulse 710b, the voltage at both the positive output 490 and the negative output 495 start at HIGH and transition at different times to LOW. Both the positive output 490 and the negative output 495 are at LOW at the end of the pulse and the beginning of the next pulse. The differential signal 720 during pulse 710b has a second pulse width 724 at a negative value while starting and ending at zero value.

Pulse 710c represents the sequence equivalent to level 4 (value=−1) of Set A. In pulse 710c, the voltage at both the positive output 490 and the negative output 495 start at LOW and transition at different times to HIGH. Both the positive output 490 and the negative output 495 are at HIGH at the end of the pulse and the beginning of the next pulse. The differential signal 720 during pulse 710c has a first pulse width 722 at a negative value while starting and ending at zero value.

Pulse 710d represents the sequence equivalent to level 1 (value=+2) of Set B. In pulse 710d, the voltage at both the positive output 490 and the negative output 495 start at HIGH and transition at different times to LOW. Both the positive output 490 and the negative output 495 are at LOW at the end of the pulse and the beginning of the next pulse. The differential signal 720 during pulse 710d has a second pulse 724 width at a positive value while starting and ending at zero value. Level 3 (value=0) which results in a differential signal that is at zero level for the duration of the sequence period is not depicted in FIG. 7.

3. Additional Embodiments

3.1 Modulator

Jitter performance in a D/A converter including a non-linear mapper, as described above, is improved by modifying the sigma-delta modulator to make the output code generated by the sigma-delta modulator change less frequently. This can be achieved by using a less aggressive quantization noise transfer function in the sigma-delta modulator. In order to make idle channel noise less sensitive to jitter, output transitions must occur less frequently. However, sigma-delta modulators have a variety of issues which can cause performance problems if they are purposefully designed to transition infrequently. If this is pushed too far then problems such as "idle tones" occur. Idle tones are low-level background tones that can be heard when the signal is very low. Idle tones are a serious problem for the listener.

Figure 9:
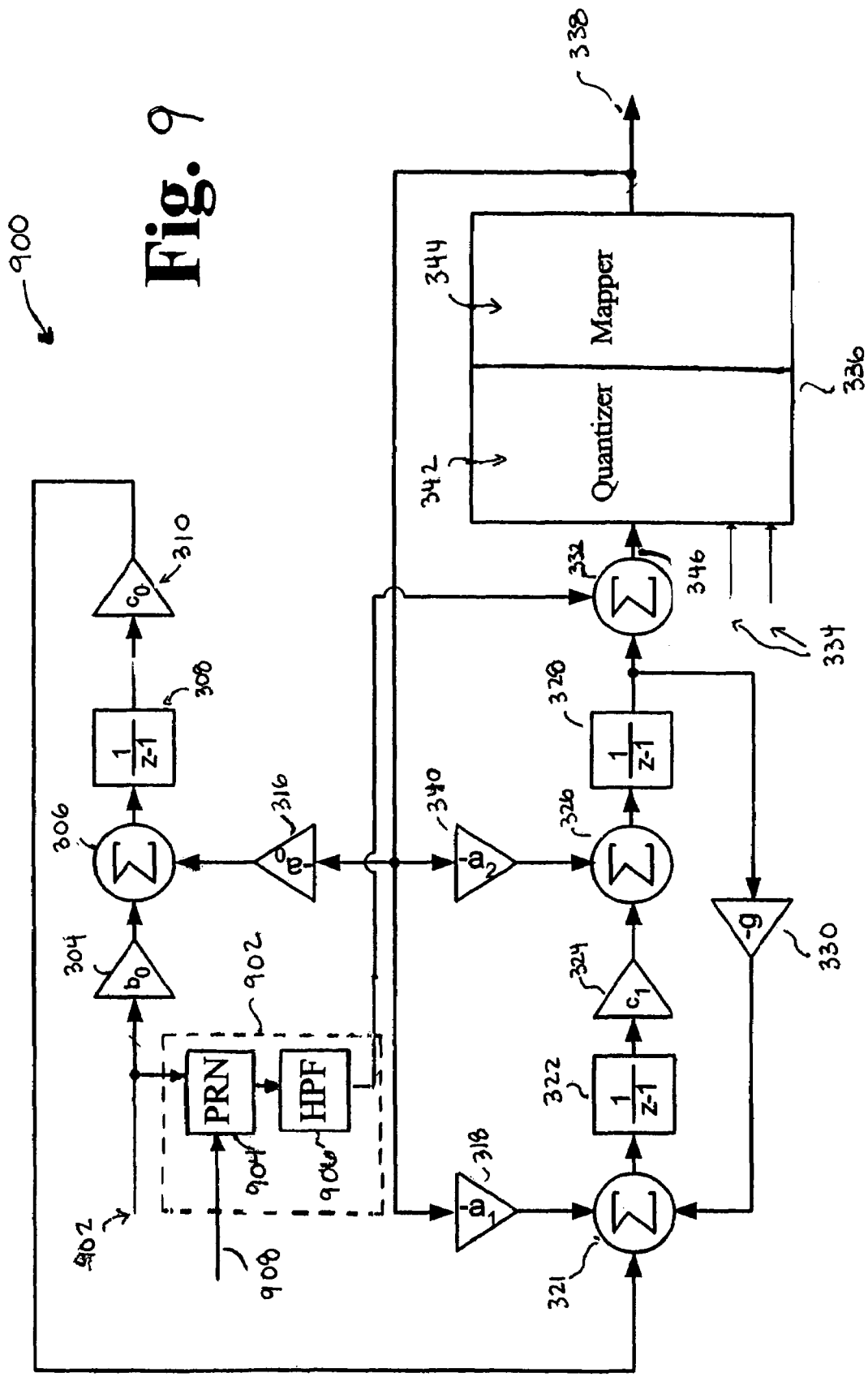
FIG. 9 is a block diagram of a modulator performing spectral shaping of a dither signal.

To address the problem of idle tones, a dither signal is added to the sigma-delta modulator. FIG. 9 is a block diagram showing a modification of the circuit of FIG. 3 to provide spectral shaping of a dither signal. In general, a dither signal is a random word sequence added to the quantizer input of the modulator to break up idle tones which would otherwise be generated due to inherent circuit characteristics when the input data stream is "idle," e.g., has a low input amplitude.

FIG. 9 illustrates a modulator circuit 900 including a dither generation circuit 902. Dither generation circuit 902 includes pseudo-random number (PRN) generator circuit 904 and filter circuit 906. Input 902, the high speed data input of the modulator circuit, is connected to the PRN generation circuit 904. A control input 908 is also connected to PRN generation circuit 904. The output of PRN generation circuit 904 is connected to filter circuit 906. Filter circuit 906 is a high-pass filter (HPF). The output of HPF 906 is connected to summer 332. Thus, the dither signal output generated by dither generation circuit 902 is added to the signal at output 346 provided to quantizer 342. For more details on a modulator providing spectral shaping of a dither signal, see U.S. patent application Ser. No. 10/767,775, entitled "System and Method for Mapping Pulse Widths in a Digital Modulator," filed Jan. 30, 2004, which is hereby incorporated by reference in its entirety.

Larger amplitudes of dither cause the modulator outputs to transition more frequently and therefore degrade the jitter performance. For this reason, it is desirable to minimize the total dither energy. However, because idle tones are such a serious problem for the listener with audio sigma-delta modulators, sufficient dither amplitude must be selected to insure that idle tones do not occur within the audio band of the spectrum. A default amplitude of dither having a standard deviation of one quarter of the code-level of the feedback codes inside the sigma-delta modulator may be used.

In addition or alternatively, to accommodate the non-linear mapper in the loop, the digital filter of the modulator is preferably configured to run M times faster than its quantizer (where M is the number of 2/3 level samples in a single code sequence of the mapper).

3.2 Mapper

Although the mapper has been described above as using a 3 level output sequence, a two level output sequence could also be implemented. In a first embodiment using a two level output sequence, the output sequence is implemented single ended with a single binary output. In a second embodiment, the output is implemented differentially using opposite signal levels.

3.3 System Architecture

A D/A converter including a non-linear mapper can be used in a variety of applications. For example, some applications use stereo D/A converters. In these applications, switching noise increases significantly if data transitions for both D/A converters do not occur simultaneously. For example, if 5-level coding is used in both stereo D/A converters, the standard deviation of pulse energy increases by a factor of 4 to 1 when the data transitions are not simultaneous. Therefore, it may be desirable for the data for both D/A converters in the stereo D/A converter pair to be handed off simultaneously using the same clock edges.

Cross-talk and interference is minimized in applications having multiple D/A converters (e.g., using the same power supply) by synchronizing all the mappers of the D/A converters such that the output sequences start at the same time.

In addition or alternatively, the transitions within the output sequences of two D/A converters should coincide when the D/A converters are outputting the same code level. If the D/A converters are sending out the same code level, all transitions in the code sequences of the mappers should coincide. That is, the mappers send out the exact same sequence, not variants that produce the same code level signal content.

4. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A digital modulator for receiving a digital input signal and converting the digital input signal into an analog signal, comprising:

a loop filter;

a quantizer coupled to the loop filter, wherein the quantizer is configured to receive an input signal from the loop filter and generate an output signal having a quantizer level of a plurality of quantizer levels; and a mapper coupled to the quantizer, wherein the mapper is configured to map the output signal from the quantizer to an output sequence comprising a plurality of symbols, and wherein the mapper includes:

definition means for defining a first sequence and a second sequence for each one of the plurality of quantizer levels, and generation means for selectively generating the output sequence, wherein the output sequence is one of the first sequence and the second sequence corresponding to the quantizer level of the output signal from the quantizer, wherein each transition of symbol value in the output sequence is separated by at least two symbols of a transitioned-to symbol value from a next transition of symbol value in the output sequence.

2. A digital modulator for receiving a digital input signal and converting the digital input signal into an analog signal, comprising:

a loop filter;

a quantizer coupled to the loop filter, wherein the quantizer is configured to receive an input signal from the loop filter and generate an output signal having a quantizer level of a plurality of quantizer levels; and a mapper coupled to the quantizer, wherein the mapper is configured to map the output signal from the quantizer to an output sequence comprising a plurality of symbols, and wherein the mapper comprises:

definition means for defining a first sequence and a second sequence for each one of the plurality of quantizer levels, generation means for selectively generating the output sequence, wherein the output sequence is one of the first sequence and the second sequence corresponding to the quantizer level of the output signal from the quantizer, a first output, and a second output, wherein a first voltage level at the first output and a second voltage level at the second output define a symbol value of a symbol in the output sequence, the first voltage level for a last symbol of a first output sequence is equal to the first voltage level for the first symbol of a next output sequence generated by the mapper, and the second voltage level for the last symbol of the first output sequence is equal to the second voltage level for the first symbol of the next output sequence generated by the mapper.

3. A digital modulator for receiving a digital input signal and converting the digital input signal into an analog signal, comprising:
    a loop filter;
    a quantizer coupled to the loop filter, wherein the quantizer is configured to receive an input signal from the loop filter and generate an output signal having a quantizer level of a plurality of quantizer levels; and
    a mapper coupled to the quantizer, wherein the mapper is configured to map the output signal from the quantizer to an output sequence comprising a plurality of symbols, and wherein the mapper comprises:
        definition means for defining a first sequence and a second sequence for each one of the plurality of quantizer levels,
        generation means for selectively generating the output sequence, wherein the output sequence is one of the first sequence and the second sequence corresponding to the quantizer level of the output signal from the quantizer,
        a first output, and
        a second output, wherein
            a first voltage level at the first output and a second voltage level at the second output define a symbol value of a symbol in the output sequence,
            the first voltage level for the first symbol of the output sequence is equal to the second voltage level for the first symbol of the output sequence,
            the first voltage level for a last symbol of the output sequence is equal to the second voltage level for the last symbol of the output sequence, and
            the first voltage level for the first symbol of the output sequence is different from the first voltage level for the last symbol of the output sequence.

4. The digital modulator of claim 1, wherein the number of symbols having a symbol value of zero in the first sequence is equal to the number of symbols having a symbol value of zero in the second sequence for each quantizer level of the plurality of quantizer levels.

5. The digital modulator of claim 1, wherein the output of the mapper is fed back as an input to the loop filter.

6. The digital modulator of claim 1, wherein the loop filter runs M times faster than the quantizer, wherein M is a number of samples of an output sequence of the mapper.

7. The digital modulator of claim 1, wherein the definition means further comprises:
    means for defining a third sequence and a fourth sequence for each level of the plurality of quantizer levels.

8. The digital modulator of claim 1, wherein the generation means selectively generates the output sequence by alternating between the first sequence and the second sequence each time an output quantized level is received by the mapper.

9. The digital modulator of claim 7, wherein the generation means selectively generates the output sequence by alternating between one of the first and second sequences and one of the third and fourth sequences each time an output quantized level is received by the mapper.

10. The digital modulator of claim 9, wherein odd quantized level values of the first sequence produce negative common mode energy, odd quantized level values of the second sequence produce positive common mode energy, odd quantized level values of the third sequence produce positive common mode energy, and odd quantized level values of the fourth sequence produce negative common mode energy.

11. The digital modulator of claim 10, wherein the generation means selectively generates the output sequence by alternating between a sequence having a negative common mode energy and a sequence having a positive common mode energy each time an odd value of the output quantized level is received.

12. The digital modulator of claim 2, wherein the number of symbols having a symbol value of zero in the first sequence is equal to the number of symbols having a symbol value of zero in the second sequence for each quantizer level of the plurality of quantizer levels.

13. The digital modulator of claim 2, wherein the generation means selectively generates the output sequence by alternating between the first sequence and the second sequence each time an output quantized level is received by the mapper.

14. The digital modulator of claim 2, wherein the definition means further comprises:
    means for defining a third sequence and a fourth sequence for each level of the plurality of quantizer levels, wherein the first sequence and second sequence are even sequences and the third sequence and fourth sequence are odd sequences.

15. The digital modulator of claim 14, wherein the generation means selectively generates the output sequence by alternating between one of the even sequences and one of the odd sequences each time an output quantized level is received by the mapper.

16. The digital modulator of claim 15, wherein odd quantized level values of the first sequence produce negative common mode energy, odd quantized level values of the second sequence produce positive common mode energy, odd quantized level values of the third sequence produce positive common mode energy, and odd quantized level values of the fourth sequence produce negative common mode energy.

17. The digital modulator of claim 3, wherein the number of symbols having a symbol value of zero in the first sequence is equal to the number of symbols having a symbol value of zero in the second sequence for each quantizer level of the plurality of quantizer levels.

18. The digital modulator of claim 3, wherein the generation means selectively generates the output sequence by alternating between the first sequence and the second sequence each time an output quantized level is received by the mapper.

19. The digital modulator of claim 3, wherein the definition means further comprises:
    means for defining a third sequence and a fourth sequence for each level of the plurality of quantizer levels.

20. The digital modulator of claim 19, wherein the generation means selectively generates the output sequence by alternating between one of the first and second sequences and one of the third and forth sequences each time an output quantized level is received by the mapper.

21. The digital modulator of claim 20, wherein odd quantized level values of the first sequence produce negative common mode energy, odd quantized level values of the second sequence produce positive common mode energy, odd quantized level values of the third sequence produce positive common mode energy, and odd quantized level values of the fourth sequence produce negative common mode energy.

* * * * *

UNITED STATES PATENT AND TRADEMARK OFFICE
CERTIFICATE OF CORRECTION

PATENT NO. : 7,593,483 B2  Page 1 of 1
APPLICATION NO. : 11/124394
DATED : September 22, 2009
INVENTOR(S) : Todd L Brooks, Kevin L Miller and Josephus A Van Engelen It is certified that error appears in the above-identified patent and that said Letters Patent is hereby corrected as shown below:

In column 14, line 54 in claim 20, please delete "forth" and insert therefor --fourth--.

Signed and Sealed this

Sixth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,593,483 B2  Page 1 of 1
APPLICATION NO. : 11/124394
DATED : September 22, 2009
INVENTOR(S) : Brooks et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1139 days.

Signed and Sealed this

Twenty-first Day of September, 2010

David J. Kappos
*Director of the United States Patent and Trademark Office*